United States Patent [19]

Ford

[11] Patent Number: 4,829,290
[45] Date of Patent: May 9, 1989

[54] LOW VOLTAGE ALERT CIRCUIT
[75] Inventor: Robert B. Ford, Tamarac, Fla.
[73] Assignee: Motorola, Inc., Schaumburg, Ill.
[21] Appl. No.: 140,520
[22] Filed: Jan. 4, 1988
[51] Int. Cl.$^4$ ............................................. G08B 21/00
[52] U.S. Cl. .................................... 340/663; 340/636
[58] Field of Search ............... 340/663, 657, 660, 636; 320/40, 48; 324/72

[56] References Cited
U.S. PATENT DOCUMENTS
3,810,144  5/1974  Clouse ............................. 340/663 X Primary Examiner—Joseph A. Orsino
Assistant Examiner—Jeffery A. Hofsass
Attorney, Agent, or Firm—Martin J. McKinley

[57] ABSTRACT

The alert circuit includes a minimum number of inexpensive discrete electronic components to provide a flashing alert when battery voltage drops below a predetermined trigger voltage. A single unijunction transistor circuit functions as a combination low voltage detector and oscillator to output periodic pulses to an LED annunciator circuit when battery voltage is low.

4 Claims, 1 Drawing Sheet

LOW VOLTAGE ALERT CIRCUIT

BACKGROUND OF THE INVENTION

This invention pertains to low voltage detection circuits and, more particularly, to a combination low voltage detection and alerting circuit that utilizes a relaxation oscillator.

In the design of battery operated radios, it is desirable to provide the user with some indication that battery charge is near depletion. To achieve higher reliability and to keep the cost of the radio at a minimum, it is also desirable to utilize a minimum number of inexpensive discrete electronic components. Accordingly, the invention described below utilizes a single unijunction transistor to output a pulsating current to an LED annunciator circuit when battery voltage drops below a predetermined trigger voltage. This pulsating current causes a light emitting diode (LED) to flash, thereby informing the user that battery charge is near depletion.

A prior art relaxation oscillator is illustrated in FIG. 1. Referring to this figure, the gate (G) voltage of a programmable unijunction transistor (PUT) 102 is established by resistors 104 and 106, which are interconnected as a voltage divider across battery 108. Capacitor 110 is charged through resistor 112. When the voltage across capacitor 110 (i.e., the voltage of the anode of PUT 102) equals the peak voltage of the PUT (the peak voltage being the gate voltage plus a small threshold voltage of approximately 0.35 volts) the PUT switches to a negative resistance mode of operation and capacitor 110 is discharged through the anode to cathode (K) path of the PUT. As the capacitor discharges, current flows through resistor 114 and a voltage pulse is developed at output terminal 116. This cycle is repeated, resulting in periodic voltage pulses at output terminal 116.

SUMMARY OF THE INVENTION

Briefly, the invention is a low voltage alert circuit that includes a three terminal relaxation device. A Zener diode is coupled to an input terminal of the alert circuit and a first resistor is coupled between the Zener diode and the first terminal of the relaxation device. A capacitor is also coupled to the first terminal of the relaxation device. A second diode is coupled between the input terminal of the alert circuit and a second terminal of the relaxation device. A second resistor is coupled between a third terminal of the relaxation device and an output terminal of the alert circuit.

DESCRIPTION OF THE PREFERRED EMBODIMENT

Figure 1:
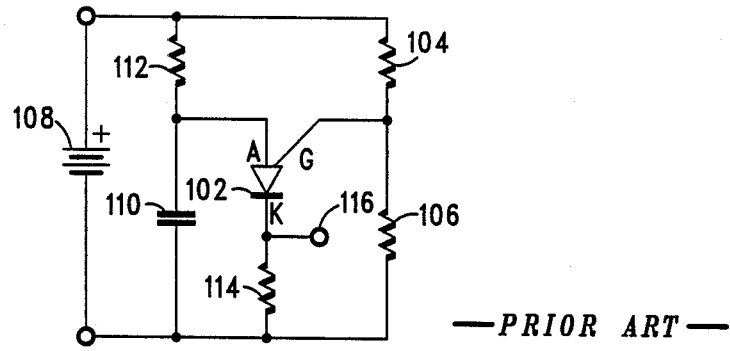
FIG. 1 is a schematic diagram of a prior art relaxation oscillator.
Figure 2:
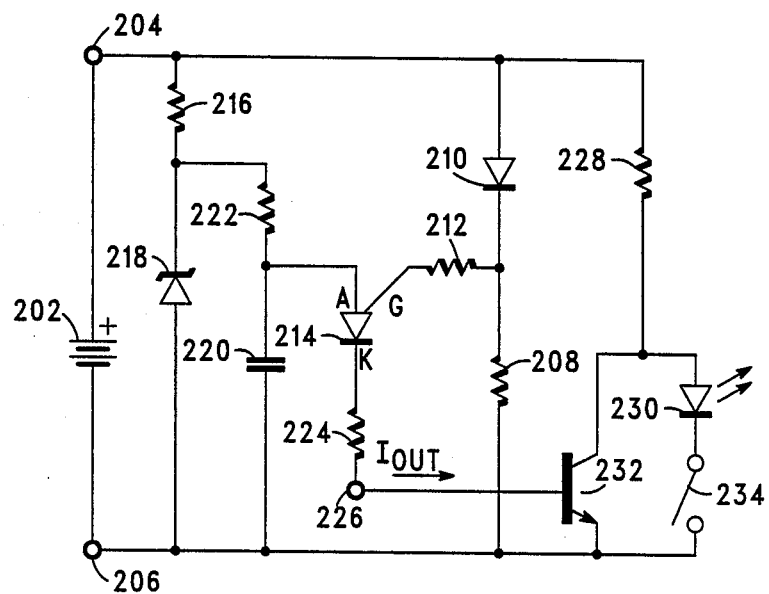
FIG. 2 is a schematic diagram of the present invention.

In FIG. 2, a schematic diagram of the preferred embodiment of the present invention is illustrated. In the description of the invention immediately below, values and part numbers are given for an exemplary embodiment of the invention that oscillates at approximately 1.5 Hz when the input voltage drops below about 6 volts (the trigger voltage). Those skilled in the art will understand how to adapt the exemplary embodiment to their own design criteria.

Referring to FIG. 2, a battery 202 is connected to first and second input terminals 204 and 206. A 10K Ohm resistor 208 causes sufficient current to flow through silicon diode 210 such that the forward voltage drop of diode 210 is approximately 0.6 volts. A 10K Ohm resistor 212 couples the cathode of diode 210 to the gate of a Motorola 2N6068 programmable unijunction transistor (PUT) 214. Since the voltage drop across resistor 212 is negligable, the gate voltage at PUT 214 is essentially clamped at 0.6 volts below the battery voltage (i.e., the voltage at input terminal 204).

A 10K Ohm resistor 216 couples a 5.6 volt Zener diode 218 to input terminal 204. Resistor 216 causes sufficient current to flow through Zener diode 218 such that the Zener voltage (5.6 volts) is developed at the cathode of the Zener diode. A 1.0 micro-Farad capacitor charges through a 100K Ohm resistor 222. A 100K Ohm resistor 224 couples the cathode of PUT 214 to an output terminal 226. A non-illustrated 30 pico-Farad capacitor may be connected between the anode and gate of PUT 214 to desensitize the circuit to strong electromagnetic fields generated by a radio transmitter.

The peak voltage of a PUT is the gate voltage plus a small threshold voltage (not to be confused with a trigger voltage of the alert circuit) of approximately 0.35 volts. If the voltage at the anode of PUT 214 (which is the voltage across capacitor 220) is below the peak voltage, the PUT is in a high impedance or off mode. If the anode voltage rises to the peak voltage, the PUT switches to a negative resistance mode in which current flows from anode to cathode, through resistor 224, and out terminal 226.

When the battery voltage is above the trigger voltage, for example, if the battery voltage equals 7.0 volts, the gate voltage will be 6.4 volts (recall that the gate voltage is clamped by diode 210 at 0.6 volts below the battery voltage) and the peak voltage will be 6.75 volts (the gate voltage plus the threshold voltage). On the anode side of the PUT, the cathode of Zener diode 218 will be clamped at 5.6 volts and resistor 222 will charge capacitor 220 to 5.6 volts. Thus, the maximum anode voltage (the voltage across capacitor 220) is 5.6 volts, which is below the peak voltage, and PUT 214 remains off.

When the battery voltage is below the trigger voltage, for example, if the battery voltage drops to 5.0 volts, the gate voltage will be 4.4 volts and the peak voltage will be 4.75 volts. The Zener diode will stop conducting and the capacitor will attempt to charge up to the battery voltage of 5.0 volts through resistors 216 and 222. But, at 4.75 volts, the voltage across capacitor 220 equals the peak voltage and PUT 214 switches on, thereby discharging capacitor 220. This cycle is repeated and periodic current pulses ($I_{OUT}$) flow out of terminal 226 as long as the battery voltage is below the trigger voltage. Thus, PUT 214, diodes 210 and 218, capacitor 220, and resistors 208, 212, 216, 222 and 224 function as a combination low voltage detector and oscillator circuit.

A 1K Ohm resistor 228 couples the anode of a light emitting diode (LED) 230 and the collector of a transistor 232 to input terminal 204. When the circuit is used with a radio transmitter, switch 234 is preferably part of a "push-to-talk" switch and would be closed during transmission. If the battery voltage is above the trigger voltage, closing switch 234 produces a steady emission of light from LED 230. If the battery voltage is below the trigger voltage and switch 234 is closed, transistor 232 saturates every time a current pulse $I_{OUT}$ appears at output terminal 226. When transistor 232 is saturated, LED 230 is shorted out by the collector-emitter circuit of the transistor and the LED is momentarily extinguished. Thus, when the battery voltage is below the trigger voltage and switch 234 is closed, LED 230 flashes. Accordingly, LED 230, transistor 232, and resistor 228 function as an LED anunciator circuit.

Although the preferred embodiment of the present invention utilizes a programmable unijunction transistor, it is also possible to substitute a conventional unijunction transistor (UJT). The emitter, base 1 and base 2 of the UJT are respectively connected to the same points in the circuit as the anode, cathode and gate terminals of the PUT circuit of FIG. 2. Appropriate adjustment of the circuit component values would, of course, be necessary, and would depend upon the particular UJT selected. Collectively, PUT's and UJT's shall be referred to as three terminal relaxation devices.

In addition, the low voltage detector and oscillator circuit could also be utilized with other annunciator circuits (besides LED 230, transistor 232 and resistor 228) such as an alert tone annunciator.

I claim as my invention:

1. A low voltage alert circuit having first and second input terminals, comprising in combination:
   a three terminal relaxation device;
   a Zener diode coupled between the first and second input terminals of said low voltage alert circuit;
   a first resistor coupled between said Zener diode and a first terminal of said relaxation device;
   a capacitor coupled between said first terminal of said relaxation device and said second input terminal of the low voltage alert circuit;
   a second diode coupled between said first input terminal and a second terminal of said relaxation device; and
   a second resistor coupled between a third terminal of said relaxation device and an output terminal of said low voltage alert circuit.

2. The low voltage alert circuit of claim 1, further comprising:
   a transistor having a first terminal coupled to said output terminal and a second terminal coupled to said second input terminal;
   a light emitting diode having a first terminal coupled to said first input terminal and to a third terminal of said transistor; and
   a switch coupled between a second terminal of said light emitting diode and said second input terminal.

3. The low voltage alert circuit of claim 1, in which a light emitting diode is operatively coupled to said output of the low alert circuit.

4. A low voltage alert circuit having first and second input terminal, comprising in combination;
   a programmable unijunction transistor;
   a Zener diode having a first terminal coupled to said second input termina;
   a first resistor coupled between said Zener diode and the anode of said unijunction transistor;
   a capacitor coupled between said anode of said unijunction transistor and said second input terminal;
   a second transistor having a first terminal coupled to said second input terminal;
   a second resistor coupled between the cathode of said unijunction transistor and a second terminal of said second transistor;
   a second diode having a first terminal coupled to an input terminal of said alert circuit;
   a third resistor coupled between a second terminal of said second diode and the gate of said unijunction transistor;
   a fourth resistor coupled between said second terminal of said second diode and said second input terminal;
   a fifth resistor coupled between a second terminal of said Zener diode and said input terminal;
   a light emitting diode having a first terminal coupled to a third terminal of said second transistor;
   a sixth resistor coupled between said first terminal of said light emitting diode and said input terminal; and
   a switch coupled between a second terminal of said light emitting diode and second input terminal.

* * * * *